(12) United States Patent
Fietz et al.

(10) Patent No.: US 8,089,779 B2
(45) Date of Patent: Jan. 3, 2012

(54) DATA PROCESSING SYSTEM

(75) Inventors: Ralf-Peter Fietz, Paderborn (DE);
Ronny Hesse, Bad Lippspringe (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 0 days.

(21) Appl. No.: 12/957,944

(22) Filed: Dec. 1, 2010

(65) Prior Publication Data

US 2011/0075358 A1 Mar. 31, 2011

Related U.S. Application Data

(63) Continuation of application No. PCT/EP2009/055727, filed on May 12, 2009.

(30) Foreign Application Priority Data

Jul. 25, 2008 (DE) .......................... 10 2008 034 704

(51) Int. Cl.
*H05K 7/14* (2006.01)
(52) U.S. Cl. ......... 361/801; 361/759; 361/740; 361/747
(58) Field of Classification Search .................. 361/801, 361/759, 807, 726, 740, 732, 796
See application file for complete search history.

(56) References Cited

U.S. PATENT DOCUMENTS

| | | | |
|---|---|---|---|
| 5,338,214 A | 8/1994 | Steffes et al. | |
| 5,544,006 A * | 8/1996 | Radloff et al. | 361/679.32 |
| 5,831,821 A | 11/1998 | Scholder et al. | |
| 6,216,184 B1 * | 4/2001 | Fackenthall et al. | 710/301 |
| 6,373,691 B1 * | 4/2002 | Chen | 361/679.32 |
| 6,724,622 B2 * | 4/2004 | Liao | 361/679.31 |
| 7,016,197 B2 * | 3/2006 | Kirner | 361/752 |
| 7,381,074 B1 | 6/2008 | Bridges et al. | |
| 7,626,830 B2 * | 12/2009 | Fan et al. | 361/801 |
| 2004/0221441 A1 | 11/2004 | Williams | |
| 2005/0122703 A1 | 6/2005 | Fan et al. | |
| 2005/0186824 A1 | 8/2005 | Liebenow | |
| 2008/0165487 A1 | 7/2008 | Tsorng et al. | |

* cited by examiner

*Primary Examiner* — Dameon Levi
(74) *Attorney, Agent, or Firm* — DLA Piper LLP (US)

(57) ABSTRACT

A data processing system with at least one mainboard is arranged in a computer housing and at least one daughter card that can be electrically connected to the mainboard by at least one riser card. A metal carrier sheet accommodates and supports the riser card and the daughter card and can be arranged together with the riser card and the daughter card in the computer housing. A metal carrier sheet includes a retaining bracket constructed to fix the riser card on the metal carrier sheet without screws. The metal carrier sheet further includes at least one angle bracket and at least one retaining bolt constructed to fix the daughter card without screws on the metal carrier sheet.

20 Claims, 6 Drawing Sheets

DATA PROCESSING SYSTEM

RELATED APPLICATIONS

This is a continuation of International Application No. PCT/EP2009/055727, with an international filing date of May 12, 2009, which is based on German Patent Application No. 10 2008 034 704.3 filed Jul. 25, 2008, the subject matter of which is incorporated by reference.

TECHNICAL FIELD

This disclosure relates to a data processing system with at least one mainboard arranged in a computer housing and at least one daughter card that can be electrically connected to the mainboard by at least one riser card.

BACKGROUND

Data processing systems of this type are used, for example, in so-called "blade servers." The particularity of blade servers is that several data processing systems of the type mentioned above are arranged one next to the other in a module rack. The individual data processing systems in blade servers are mounted in individual computer housings and inserted into the module rack. The individual data processing systems are coupled via a common rear-side board of the module rack, also called a "backplane," and together form a server system. Interfaces that electrically connect the individual data processing systems to the backplane are formed on each of the individual data processing systems. The individual data processing systems are generally very flat in construction and require very little installation space. This external feature is the basis for the name blade server, since each of the individual data processing systems of a blade server resembles a blade due to its small overall height. In addition, the individual data processing systems are supplied with energy and cooling air via a common power supply system and a common ventilation system. Thus, the processing systems in the module rack share a common power and cooling air supply.

To achieve a high variability of the individual data processing systems, additional computer cards, referred to below as "daughter cards," should be installable in the individual computer housings, despite a low amount of space. To achieve this, so-called "riser cards" are used. An arrangement of a daughter card parallel to the mainboard of the data processing system is possible by the riser cards.

A riser card is a computer expansion card for a data processing system that can be used to arrange one or more daughter cards parallel in their spatial position to the mainboard. Riser cards are commercially available in various models. A distinction is made between passive and active riser cards, wherein the passive riser cards merely extend the contact terminals of the multi-pole connectors on the mainboard and thus supply the daughter card. Active riser cards additionally have control electronics used for managing the resources of the daughter card connected to the riser card.

Solutions are already known from U.S. Pat. Nos. 5,338,214, 5,544,006 and 5,831,821 in which riser cards as well as one or more daughter cards are held in an installation housing and the module is finally mounted on the mainboard of a computer system. In that case, the riser cards and/or the daughter cards are fixed by bolted connections to the installation housing.

This represents an increased assembly expense, with an assembly proving to be very laborious and difficult to handle precisely in narrow blade server systems.

It could therefore be helpful to reduce the production and assembly expense in the manufacturing of a data processing system and nonetheless construct a high-quality data processing system.

SUMMARY

We provide a data processing system including a mainboard arranged in a computer housing, a daughter card which in association with one riser card can be electrically connected to the mainboard, a metal carrier sheet constructed to accommodate and support the riser card and the daughter card and can be arranged together with the riser card and the daughter card in the computer housing, the metal carrier sheet includes a retaining bracket constructed to fix the riser card without screws on the metal carrier sheet, at least one angle bracket, and at least one retaining bolt to fix the daughter card on the metal carrier sheet without screws.

REFERENCE NUMBERS

1 Daughter card
2 Riser card
3 Metal carrier sheet
4 Centering sleeve
5 Retaining bolt
6 Retaining hole
7 Angle bracket
8 Retaining bracket
9 Support bracket
10 Locking element
11 Multi-pole connector of the riser card
12 Interfaces of the daughter card
13 Mainboard
14 Interfaces of the mainboard
15 Multi-pole connector of the mainboard
16 Angled section
17 Centering bolt
18 Centering hole

DETAILED DESCRIPTION

For a data processing system with at least one mainboard arranged in a computer housing and at least one daughter card that can be electrically connected to the mainboard by at least one riser card, the above-mentioned issues are addressed by a metal carrier sheet. The metal carrier sheet is constructed to accommodate and support the riser card and the daughter card and can be arranged together with the riser card and daughter card in the computer housing. The metal carrier sheet comprises a retaining bracket which is constructed to fix the riser card on the metal carrier sheet without screws. The metal carrier sheet further comprises at least one angle bracket and at least one retaining bolt that are constructed to fix the daughter card without screws on the metal carrier sheet.

A metal carrier sheet arranged in the computer housing thus forms a static base for the daughter card accommodated with it as well as for the riser card accommodated with it. This has the effect that the mainboard remains free of fixing devices for the riser card or the daughter card, although the daughter card accommodated by it is arranged parallel to the mainboard in the data processing system. Therefore, more free installation space for forming conductor traces and population with components remains on the mainboard. In addition, the metal carrier sheet absorbs mechanical forces that act on the interfaces of the data processing system when the interfaces are inserted onto the back plane during the arrangement of the data processing system in a module rack. These mechanical forces result from overcoming frictional forces during introduction of the data processing systems, or mating the electrical contacts with the interfaces on the back plane.

The forces are directly transmitted from the interfaces to the daughter cards and are passed on to the metal carrier sheet and thus are diverted into the computer housing. High mechanical stresses are thereby diverted from the daughter card and malfunctions due to hairline cracks in the conductor traces are avoided. Furthermore, a high dimensional precision in the arrangement of the interfaces is provided by the metal carrier sheet, so that tilting and incorrect fitting during the mating of the electrical contacts are avoided.

The angle bracket cooperates with the retaining bolt for screwless fixation of the daughter card on the metal carrier sheet. The screwless fixation reduces the installation expense for the daughter card and facilitates service work on the data processing system since the fixation of the daughter card with the angle bracket is quick and easy to form and also to release.

Because of the screwless installation of the riser card on the metal carrier sheet via the retaining bracket, the riser card can be quickly, easily and nonetheless precisely mounted, independently of the daughter card. Thus, an independent installation or removal of daughter cards is possible in the manufacturing process for the data processing system, as well as in later maintenance work. This also permits expansion of a data processing system without difficulty in later maintenance work. Mechanical forces that act on the riser card are diverted by the retaining bracket onto the metal carrier sheet. Malfunctions on the daughter card that are attributable to mechanical stresses on the riser card are therefore avoidable.

One feature of the data processing system provides for the cooperation of the retaining bolt on the metal carrier sheet with a retaining hole on the daughter card, whereby, on the one hand, the daughter card is spaced away from the surface of the metal carrier sheet and, on the other, the mechanical forces are transferred by the retaining bolt onto the metal carrier sheet. The retaining bolt is preferably a cylindrical body that is arranged vertically on the metal carrier sheet and, at one end, facing away from the metal carrier sheet has a taper which is provided to cooperate with the retaining hole of the daughter card in a form-fitting manner.

The daughter card is preferably seated in a floating manner on the retaining bolt. That is to say, the daughter card is movable on the retaining bolt within predetermined degrees of freedom. Thus, horizontal movement of the daughter card, i.e., parallel to the plane of the daughter card is possible within predetermined limits. A daughter card that is constructed in its two-dimensional extent in such a manner that it overlaps another daughter card can be displaced horizontally to a certain extent by the floating seating so that the overlapped daughter card is freely accessible.

A further feature of the data processing system comprises a support bracket constructed to receive the riser card together with the retaining bracket in a form-fitting manner. The support bracket is constructed in such a manner that, in cooperation with the retaining bracket, it easily permits an arrangement of the riser card spaced away from the metal carrier sheet. Thus, the riser card can also be arranged spaced away from the metal carrier sheet independently of the daughter card.

A resiliently constructed locking element may be arranged on the retaining bracket. The riser card is thereby locked in place in the retaining bracket without the use of screws. The screwless fixation has the advantage of a time-saving assembly of the riser card on the metal carrier sheet and thus reduces the production expense for the data processing system.

The metal carrier sheet may have an angled section on at least one lateral side. This angled section cooperates with the computer housing so that the metal carrier sheet accommodated in the computer housing is fixed in the computer housing by the angled section. This angled section additionally yields an improvement in the torsion resistance of the metal carrier sheet, so that the metal carrier sheet with an already accommodated daughter card and riser card is sufficiently torsion-resistant to be able to avoid mechanical stresses due to distortions of the daughter card, the riser card, or the daughter card and the riser card relative to one another. The angled section also includes the advantage that the metal carrier sheet can be fixed easily to the computer housing with it.

The metal carrier sheet may be arranged parallel to the mainboard in the computer housing. This results in a bridge-like arrangement of the metal carrier sheet over the mainboard and over the entire width of the computer housing. The metal carrier sheet thus also contributes to the torsion-resistance of the entire computer housing for the data processing system.

The data processing system may also comprise at least one respective centering means on both the metal carrier sheet and the mainboard. These centering means cooperate in a form-fitting manner as soon as the metal carrier sheet is arranged in the computer housing. The centering means have the effect that the daughter card is positioned precisely relative to the mainboard and thus the interfaces of the mainboard, along with the interfaces of the daughter card, can be precisely introduced, without offsets and true to dimension, into the interface contacts of the backplane. For this purpose, the daughter card has a centering hole that cooperates with the centering means. Mechanical distortions that prevent mating of the interfaces are thereby avoided. Further, the centering means may be formed from a centering sleeve and a centering bolt.

The angle bracket may be constructed resiliently, with the resiliently constructed angle bracket having a locking tab. The daughter card is locked to the metal carrier sheet with this locking tab.

The retaining bracket, which may be constructed to accommodate the riser card, may be adapted in shape and size to the dimensions of a multi-pole connector of the riser card in such a manner that the multi-pole connector of the riser card is surrounded in a form-fitting manner by the retaining bracket on at least three external sides. Thus, the multi-pole connector of the riser card and therefore the entire riser card are easily and securely fixed on the metal carrier sheet by the retaining bracket and the resiliently constructed locking element.

The support bracket may be arranged in the manner of a bridge on the metal carrier sheet and supports the riser card on at least one side of the multi-pole connector of the riser card. Thus, the multi-pole connector of the riser card is held in a form-fitting manner between the support bracket and the retaining bracket. The spaced-away fixation of the riser card is thereby improved in its construction.

Figure 1:
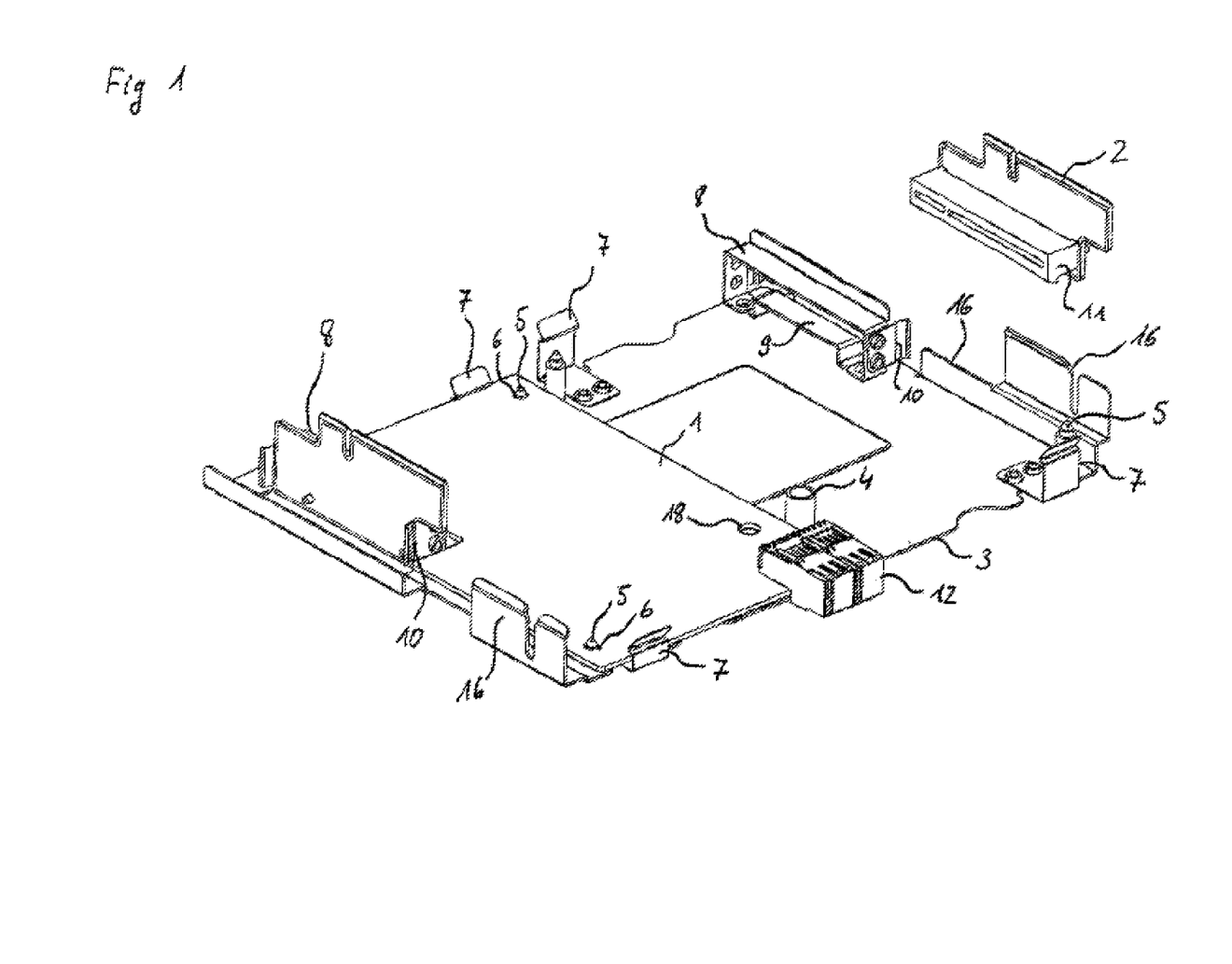
FIG. 1 shows a perspective representation of the metal carrier sheet with a daughter card.

Turning now to the drawings, FIG. 1 shows a perspective view of a daughter card 1, a riser card 2 and a metal carrier sheet 3. Metal carrier sheet 3 comprises a centering sleeve 4 that is arranged on metal carrier sheet 3. Retaining bolts 5 that are arranged to be accommodated in retaining holes 6 in respectively opposite outer corners of daughter card 1 are also arranged on metal carrier sheet 3. At least one retaining hole 6 on daughter card 1 is provided for each retaining bolt 5. A daughter card 1 accommodated on metal carrier sheet 3 accordingly accommodates retaining bolts 5 in retaining holes 6. For this purpose, the retaining bolts 5 are cylindrical in construction and have a cylindrical taper at the end facing away from the surface of metal carrier sheet 3. Centering sleeve 4 is a cylindrical hollow body that is arranged vertically on the surface of metal carrier sheet 3.

Each retaining bolt 5 is associated with an angle bracket 7 in its vicinity, which is constructed as a spring plate bent over at a right angle. Angle bracket 7 additionally comprises a locking tab that fixes the daughter card 1 spaced away from the surface of metal carrier sheet 3 by the retaining bolts 5. By the cooperation of retaining bolt 5, retaining hole 6, daughter card 1 and angle bracket 7, daughter card 1 is fixed on metal carrier sheet 3 a predetermined distance away from metal carrier sheet 3. In that way the distance away from metal carrier sheet 3 is precisely configured. The daughter card remains movable horizontally within predetermined limits.

FIG. 1 further shows, on an outer corner of metal carrier sheet 3 without a retaining bolt 5, a retaining bracket 8 that is constructed to accommodate riser card 2 in cooperation with a support bracket 9. A locking element 10, in particular a resiliently seated locking element 10, which locks a multi-pole connector 11 of riser card 2 in place between retaining bracket 8 and support bracket 9, is also provided on retaining bracket 8. Multi-pole connector 11 of riser card 2 is connected to riser card 2 in such a manner that, by multi-pole connector 11 of riser card 2 and its fixation between retaining bracket 8 and support bracket 9 and resiliently seated locking element 10, riser card 2 is also fixed in place on metal carrier sheet 3.

FIG. 1 further shows metal carrier sheet 3 in an example in which it is constructed to accommodate two daughter cards 1 next to one another. For this purpose, a respective retaining bracket 8 with a support bracket 9 and at least one respective resiliently seated locking element 10 is provided at the opposing outer sides of metal carrier sheet 3. Two retaining bolts 5 and a centering sleeve 4 are likewise provided respectively at the accommodation position for the first or second daughter card 1.

Figure 2:
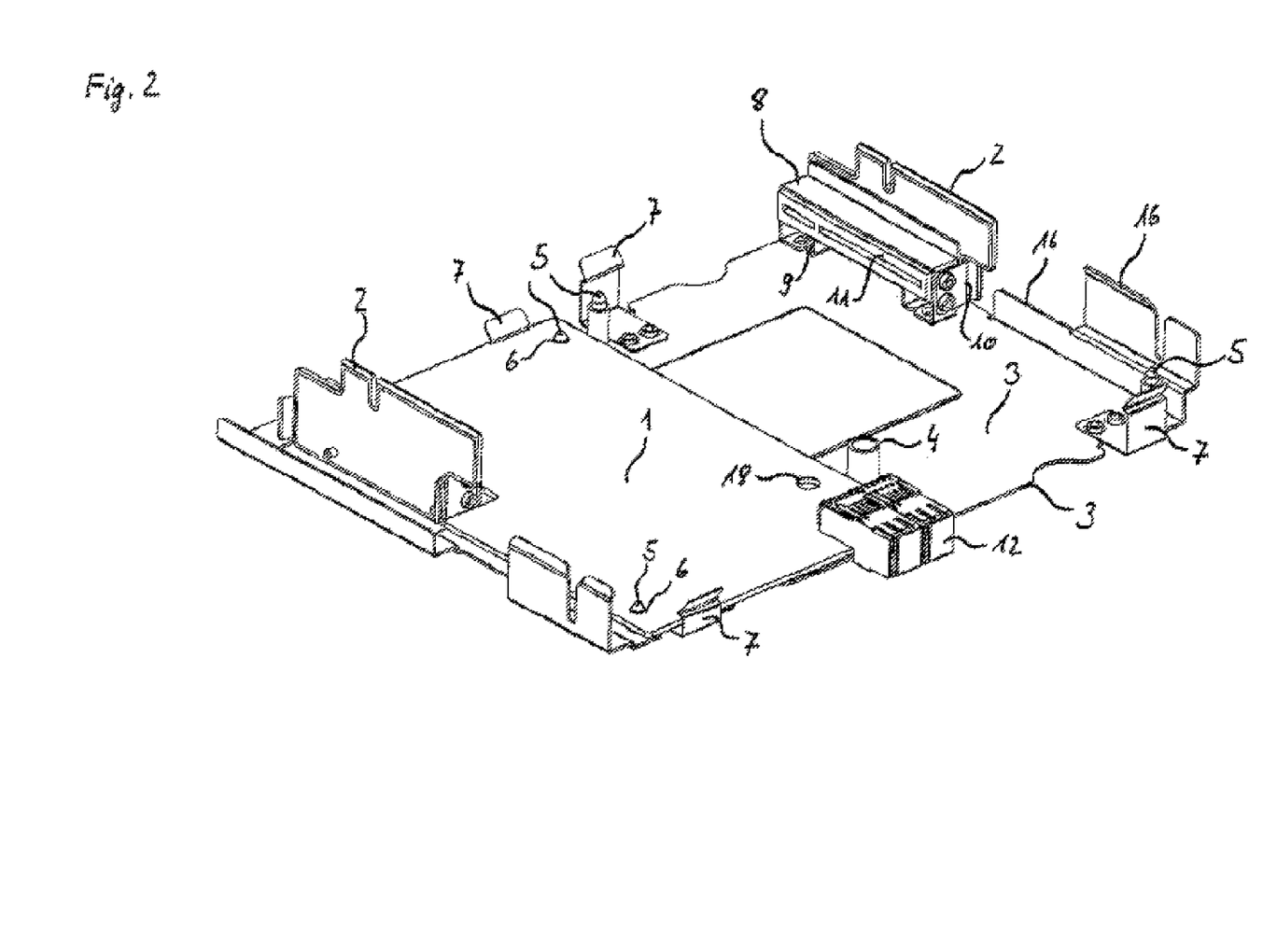
FIG. 2 shows a perspective representation of the metal carrier sheet with a riser card.

FIG. 2 shows a perspective representation of the metal carrier sheet 3 already described in FIG. 1, wherein multi-pole connector 11 of riser card 2 is accommodated between retaining bracket 8 and support bracket 9. The resiliently constructed locking element 10 holds multi-pole connector 11 of riser card 2 locked between retaining bracket 8 and support bracket 9.

Figure 3:
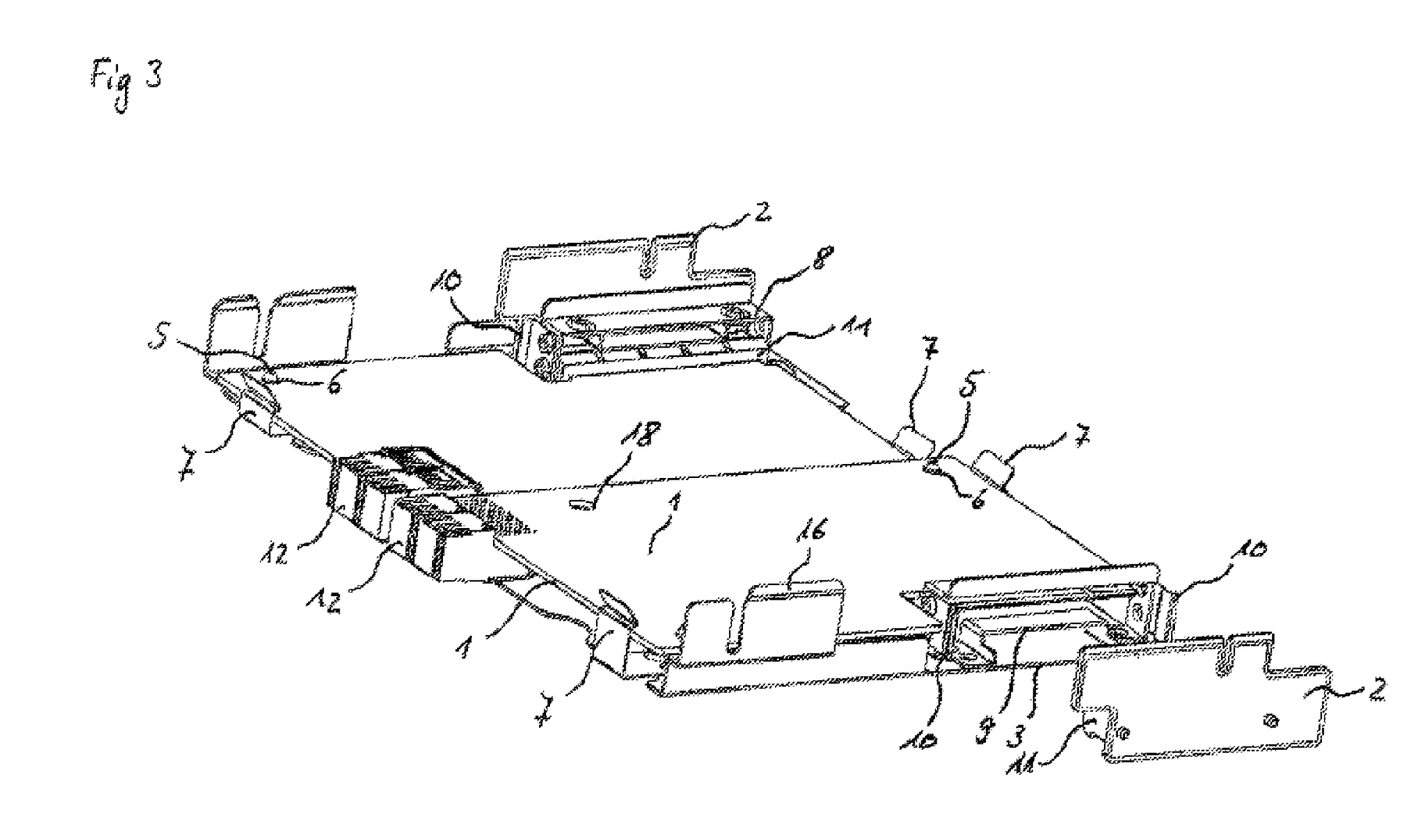
FIG. 3 shows a perspective representation of the metal carrier sheet with two daughter cards.

FIG. 3 shows a metal carrier sheet 3 with two daughter cards 1. For the daughter cards 1 accommodated on metal carrier sheet 3, a respective angle bracket 7 engages with the outside edge of each daughter card 1. This fixes the daughter card 1 spaced away from metal carrier sheet 3 by retaining bolt 5 and retaining hole 6. In addition, only daughter card 1 is mounted on metal carrier sheet 3 in FIG. 3; riser card 2 is shown uninstalled.

Figure 4:
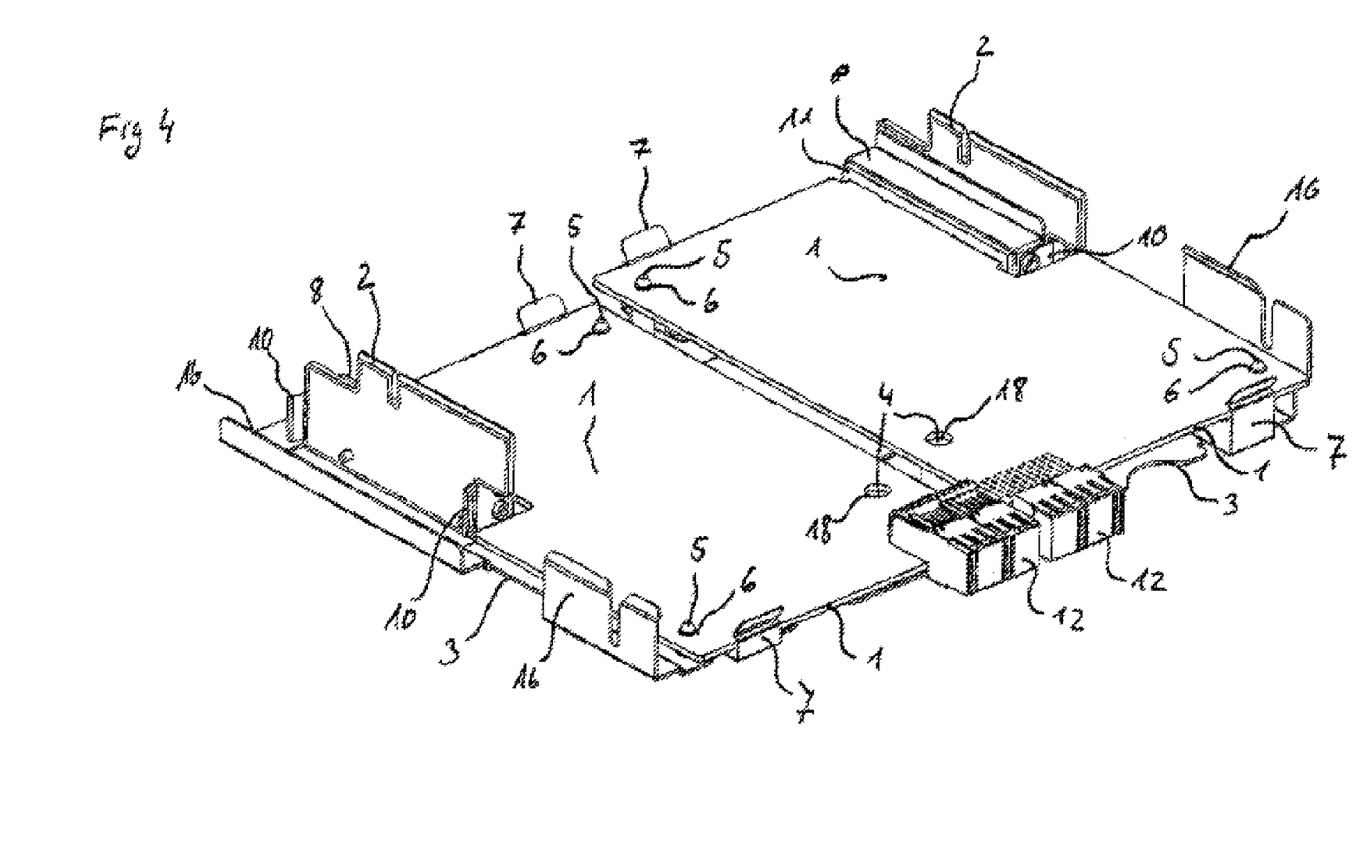
FIG. 4 shows a perspective representation of the metal carrier sheet with two daughter cards and two riser cards.

FIG. 4 shows a perspective representation of preassembled metal carrier sheet 3 with 2 daughter cards 1, each comprising interfaces 12. The daughter cards 1 are arranged as axial reflections of one another, so that the interfaces 12 of the respective daughter cards 1 are oriented in alignment with one another. Due to an excentric arrangement of the interfaces 12 on daughter cards 1, the daughter cards 1 are arranged on metal carrier sheet 3 in two different planes to achieve the alignment of interfaces 12 with one another. Correspondingly, the retaining brackets 5 and the angle brackets 7 for each of the two daughter cards 1 are formed with mutually different lengths. The centering sleeve 4 for each of the two daughter cards 1 is likewise adapted to the different planes by mutually different lengths of centering sleeve 4. Angled sections 16, which enable a fixation of metal carrier sheet 3 in a computer housing and also improve the torsion-resistance of metal carrier sheet 3, are arranged at the outside edges of metal carrier sheet 3.

For general understanding, axial reflection can be defined as follows. The axial reflection associates with each point an image point that is determined in that the connection line of the two points is bisected at a right angle by a reflection axis. The fixed points of an axial reflection are precisely the points of the reflection axis. This axis is, therefore, also referred to as a fixed point line. The axial reflection is a congruence mapping. If there are two congruent objects, they can be transformed one into another in each case by composition of at most three axial reflections. Axial reflection is therefore used as a fundamental concept of metric geometry.

FIG. 4 further shows daughter cards 1 accommodated on metal carrier sheet 3 which are already in electrical contact with riser cards 2 accommodated on metal carrier sheet 3. The different installation planes of the daughter cards 1 are likewise taken into account for the fixation of the riser cards 2, and a different installation plane for the riser cards 2 is formed by the support bracket 9.

Figure 5:
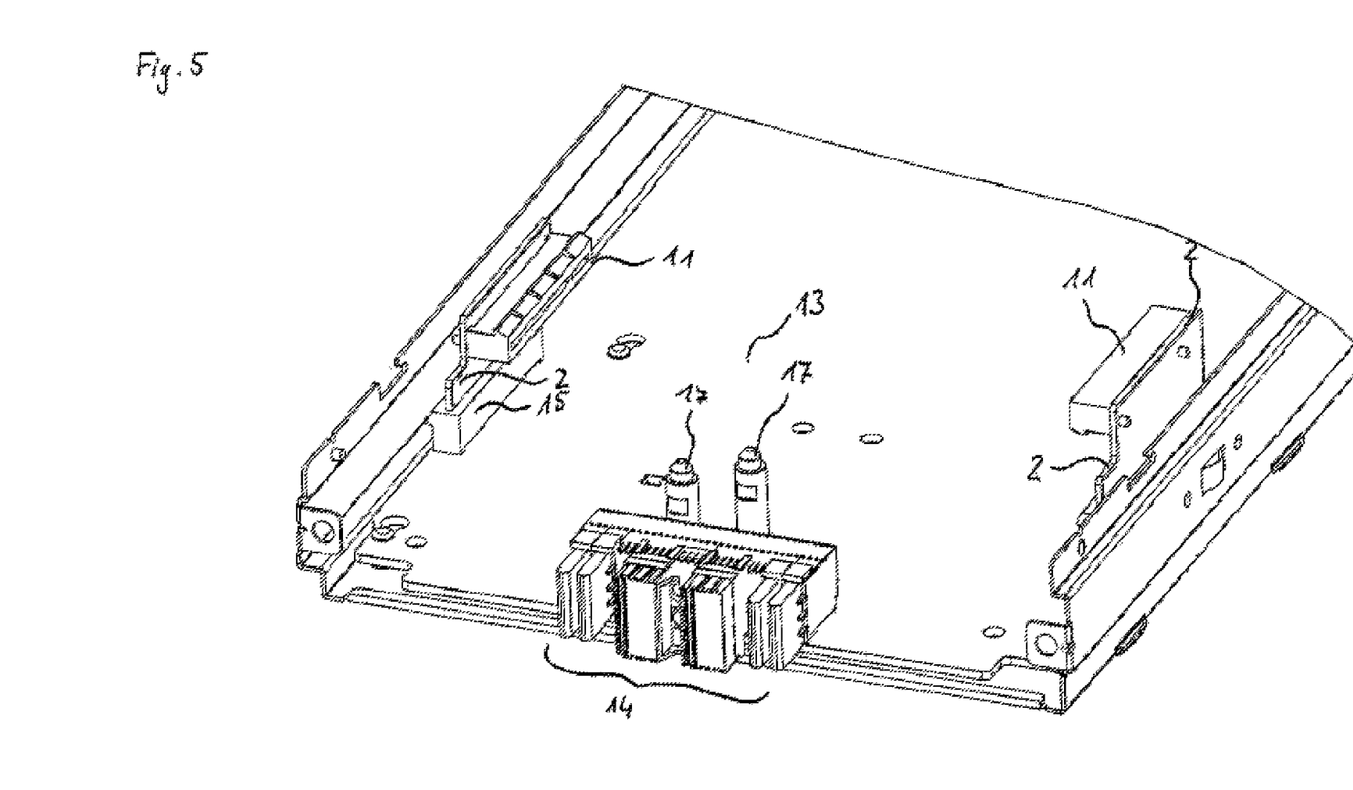
FIG. 5 shows a perspective representation of a data processing system with a mainboard.

FIG. 5 shows a data processing system in a computer housing with a mainboard 13 and its interfaces 14 to a backplane. Centering bolts 17, which are constructed in mutually different lengths in accordance with the different installation planes of the daughter cards 1, are arranged on mainboard 13. Mainboard 13 has a multi-pole connector 15 at its respective outer sides to accommodate riser card 2. An exact positioning of the daughter cards 1 in the horizontal direction is achieved by centering bolts 17.

Figure 6:
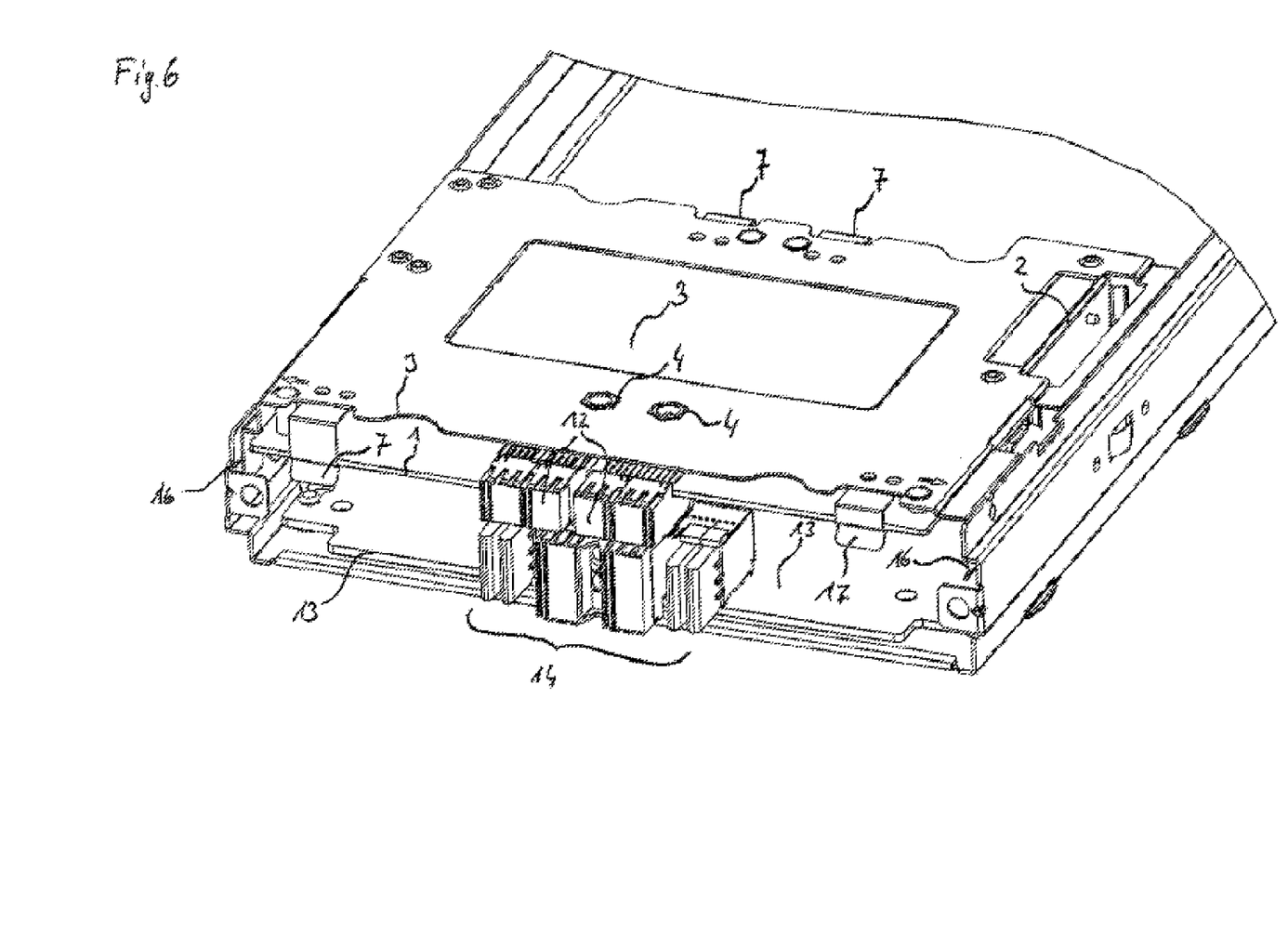
FIG. 6 shows a perspective representation of a data processing system with a metal carrier sheet.

FIG. 6 shows the data processing system with an installed metal carrier sheet 3 and the above-described riser cards 2 and daughter cards 1 accommodated on metal carrier sheet 3. By centering holes 17 and centering sleeves 4, together with a centering hole 18 on one of the daughter cards 1, it is possible to orient the interfaces 12 and 14 precisely with respect to one another so that the daughter cards 1 are positioned so precisely that their interfaces 12 along with the interfaces 14 of mainboard 13 can be inserted jointly into the opposing parts on the backplane without distortions arising due to offsets or the insertion becoming impossible. By the above-described fixation of daughter cards 1 by retaining bolts 5 and centering bolts 17 together with centering sleeves 4 it becomes possible to fix the daughter cards 1 sufficiently stably to be able to absorb insertion forces and tensile forces during the installation of the data processing system in a module rack and its plug-in system, or its removal therefrom.

Although the apparatus and methods have been described in connection with specific forms thereof, it will be appreciated that a wide variety of equivalents may be substituted for the specified elements described herein without departing from the spirit and scope of this disclosure as described in the appended claims.

What is claimed is:

1. A data processing system comprising:
a mainboard arranged in a computer housing;
a daughter card which in association with one riser card can be electrically connected to the mainboard; and
a metal carrier sheet constructed to accommodate and support the riser card and the daughter card and which can be arranged together with the riser card and the daughter card in the computer housing;
the metal carrier sheet comprising:
 1) a retaining bracket constructed to fix the riser card without screws on the metal carrier sheet;
 2) at least one angle bracket; and
 3) at least one retaining bolt to fix the daughter card on the metal carrier sheet without screws.

2. The data processing system according to claim 1, wherein the retaining bolt cooperates with at least one retaining hole on the daughter card.

3. The data processing system according to claim 1, further comprising a support bracket constructed to receive, together with the retaining bracket, the riser card in a form-fitting manner.

4. The data processing system according to claim 1, wherein the retaining bracket comprises a resiliently constructed locking element that fixes the riser card in the retaining bracket.

5. The data processing system according to claim 1, wherein the metal carrier sheet has a first angled section on at least one peripheral side that cooperates with the computer housing such that the metal carrier sheet accommodated in the computer housing is held in place by the angled section.

6. The data processing system according to claim 1, wherein the metal carrier sheet is arranged substantially parallel to the mainboard in the computer housing.

7. The data processing system according to claim 1, further comprising at least one centering means arranged on the metal carrier sheet and the mainboard, wherein the centering means cooperate in a form-fitting manner when the metal carrier sheet is arranged in the computer housing.

8. The data processing system according to claim 7, wherein the daughter card has a centering hole that cooperates with the centering means when the daughter card is arranged with the metal carrier sheet in the computer housing.

9. The data processing system according to claim 7, wherein the centering means are formed from a centering sleeve and a centering bolt.

10. The data processing system according to claim 1, wherein the angled bracket is resiliently constructed and comprises a locking tab with which the daughter card is locked in place.

11. The data processing system according to claim 1, wherein the retaining bracket is adapted in shape and size to the dimensions of a multi-pole connector of the riser card such that the multi-pole connector of the riser card is surrounded in a form-fitting manner by the retaining bracket on at least three external sides.

12. The data processing system according to claim 3, wherein the support bracket is arranged in a bridge-like manner on the metal carrier sheet and receives the riser card on at least one side of the multi-pole connector thereof in a supporting manner so that the multi-pole connector of the riser card is received in a form-fitting manner between the support bracket and the retaining bracket.

13. The data processing system according to claim 2, further comprising a support bracket constructed to receive, together with the retaining bracket, the riser card in a form-fitting manner.

14. The data processing system according to claim 2, wherein the retaining bracket comprises a resiliently constructed locking element that fixes the riser card in the retaining bracket.

15. The data processing system according to claim 3, wherein the retaining bracket comprises a resiliently constructed locking element that fixes the riser card in the retaining bracket.

16. The data processing system according to claim 2, wherein the metal carrier sheet has a first angled section on at least one peripheral side that cooperates with the computer housing such that the metal carrier sheet accommodated in the computer housing is held in place by the angled section.

17. The data processing system according to claim 3, wherein the metal carrier sheet has a first angled section on at least one peripheral side that cooperates with the computer housing such that the metal carrier sheet accommodated in the computer housing is held in place by the angled section.

18. The data processing system according to claim 4, wherein the metal carrier sheet has a first angled section on at least one peripheral side that cooperates with the computer housing such that the metal carrier sheet accommodated in the computer housing is held in place by the angled section.

19. The data processing system according to claim 2, wherein the metal carrier sheet is arranged substantially parallel to the mainboard in the computer housing.

20. The data processing system according to claim 3, wherein the metal carrier sheet is arranged substantially parallel to the mainboard in the computer housing.

* * * * *